United States Patent
Tanaka

(10) Patent No.: US 12,438,070 B2
(45) Date of Patent: Oct. 7, 2025

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventor: Koichi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 444 days.

(21) Appl. No.: 18/058,436

(22) Filed: Nov. 23, 2022

(65) Prior Publication Data
US 2023/0317578 A1    Oct. 5, 2023

(30) Foreign Application Priority Data
Apr. 1, 2022 (JP) .................... 2022-061965

(51) Int. Cl.
| | | |
|---|---|---|
| *H01L 23/498* | (2006.01) | |
| *H01L 21/48* | (2006.01) | |
| *H01L 23/535* | (2006.01) | |

(52) U.S. Cl.
CPC .... *H01L 23/49811* (2013.01); *H01L 21/4842* (2013.01); *H01L 21/4853* (2013.01); *H01L 23/535* (2013.01)

(58) Field of Classification Search
CPC .......... H01L 23/49811; H01L 21/4842; H01L 21/4853; H01L 21/4875
See application file for complete search history.

(56) References Cited

U.S. PATENT DOCUMENTS

2020/0035643 A1 *   1/2020   Hirata ................. H10F 39/811

FOREIGN PATENT DOCUMENTS

JP          2017-199713 A        11/2017

* cited by examiner

*Primary Examiner* — Evan G Clinton
(74) *Attorney, Agent, or Firm* — Studebaker Brackett PLLC

(57) ABSTRACT

According to the present disclosure, a semiconductor device comprises an insulating substrate having a wiring pattern in a surface layer thereof and a terminal electrode having a bag-shaped internal space with a terminal electrode tip aperture. The terminal electrode is grounded in a freestanding state by mating with the wiring pattern.

3 Claims, 3 Drawing Sheets

SEMICONDUCTOR DEVICE AND METHOD FOR MANUFACTURING SEMICONDUCTOR DEVICE

BACKGROUND OF THE INVENTION

Field

The present disclosure relates to a semiconductor device and method for manufacturing semiconductor device.

Background

JP 2017-199713 A discloses ultrasonic welding, which is one technology for welding a terminal electrode to a wiring pattern on an insulating substrate. With ultrasonic welding, ultrasonic acoustic vibrations are imparted to an interface under load to generate friction and initiate a reaction.

However, when generating friction at the interface between a wiring pattern and a terminal electrode in the method described above, there is a problem in that fine metal powder is scattered, which lowers the reliability of the semiconductor device.

SUMMARY

In view of the above-described problems, an object of the present disclosure is to provide a highly reliable semiconductor device and method for manufacturing the same in which a wiring pattern and a terminal electrode are welded together without scattering fine metal powder.

The features and advantages of the present disclosure may be summarized as follows.

A semiconductor device according to the present disclosure includes: an insulating substrate having a wiring pattern in a surface layer thereof; and a terminal electrode having a bag-shaped internal space with a terminal electrode tip aperture, wherein the terminal electrode is grounded in a freestanding state by mating with the wiring pattern.

Other and further objects, features and advantages of the disclosure will appear more fully from the following description.

DESCRIPTION OF EMBODIMENTS

First Embodiment

Before describing a first embodiment, a technology of the related art known as ultrasonic welding for welding a terminal electrode to a wiring pattern on an insulating substrate will be described. With ultrasonic welding, first, the tip of a terminal electrode is positioned on top of a wiring pattern on an insulating substrate. At this time, the terminal electrode tip is made to contact the wiring pattern. If ultrasonic acoustic vibrations are imparted to the contact portion under load, the terminal electrode tip resonates and friction is generated at the interface between the wiring pattern on the insulating substrate and the terminal electrode tip. The friction scatters an oxide film formed on the surface layer of the interface, thereby exposing a fresh surface. On the fresh surface, atomic motion is activated by heating due to the heat of friction, which induces motion in metal atoms through diffusion. The motion produces mutual attraction between the metal atoms and creates a solid-state weld between the wiring pattern and the terminal electrode.

As described above, in ultrasonic welding, both a load and ultrasonic acoustic vibrations are applied. That is, an ultrasonic wave generator is made to generate a high-frequency AC current and thereby supply electric energy to an oscillator, which causes the oscillator to convert and propagate the electric energy as mechanical vibrations to apply vibrations to the terminal electrode tip under load.

However, when the terminal electrode tip resonates and friction is generated between the terminal electrode tip and the wiring pattern on the insulating substrate, the scattering of fine metal powder creates the problem of lowering the reliability of the semiconductor device. This is a particularly serious problem in the case of a semiconductor device that uses a large amount of power, such as a power semiconductor intended for electrical railway or power applications, for example, because the metal powder may induce dielectric breakdown due to corona discharge.

Accordingly, an objective of the present disclosure is to provide a semiconductor device that addresses this problem.

Figure 1:
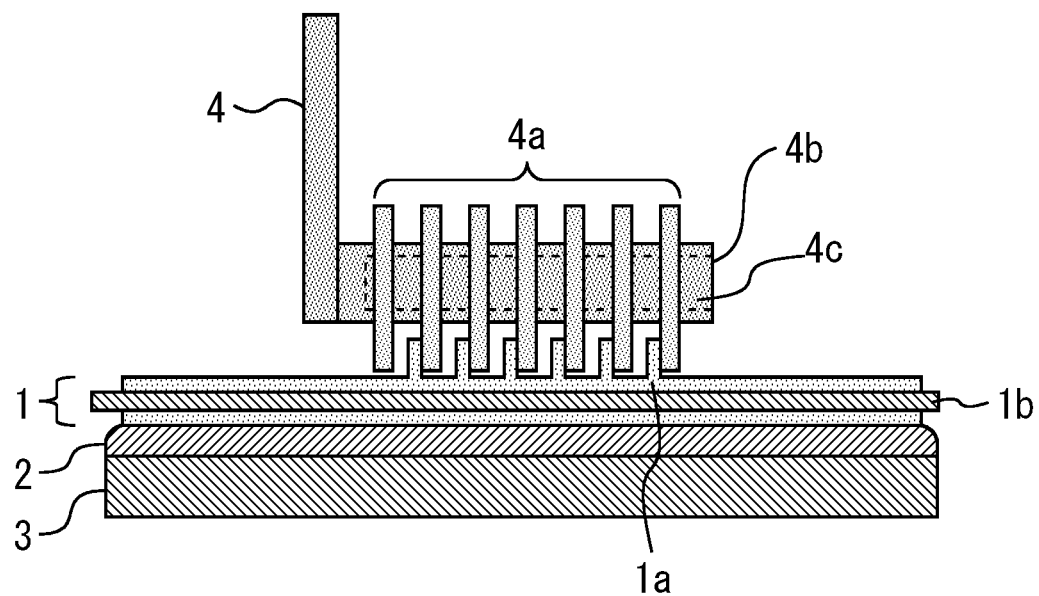
FIG. 1 is a cross section illustrating the pre-welding state of a weld structure according to the first embodiment of the present disclosure.

FIG. 1 is a cross section illustrating the pre-welding state of a weld structure according to the first embodiment of the present disclosure. The weld structure according to the first embodiment comprises an insulating substrate 1. The insulating substrate 1 includes a wiring pattern 1a having raised shapes on the surface layer, and a ceramic substrate 1b internally. The wiring pattern 1a is formed from aluminum (Al), copper (Cu), or their alloys. The ceramic substrate 1b is formed from an inorganic ceramic material such as alumina (Al2O3), aluminum nitride (AlN), or silicon nitride (Si4N4). The insulating substrate 1 is also welded to a heatsink 3 via a bonding material 2. A terminal electrode 4 is positioned directly above the wiring pattern 1a.

Figure 2:
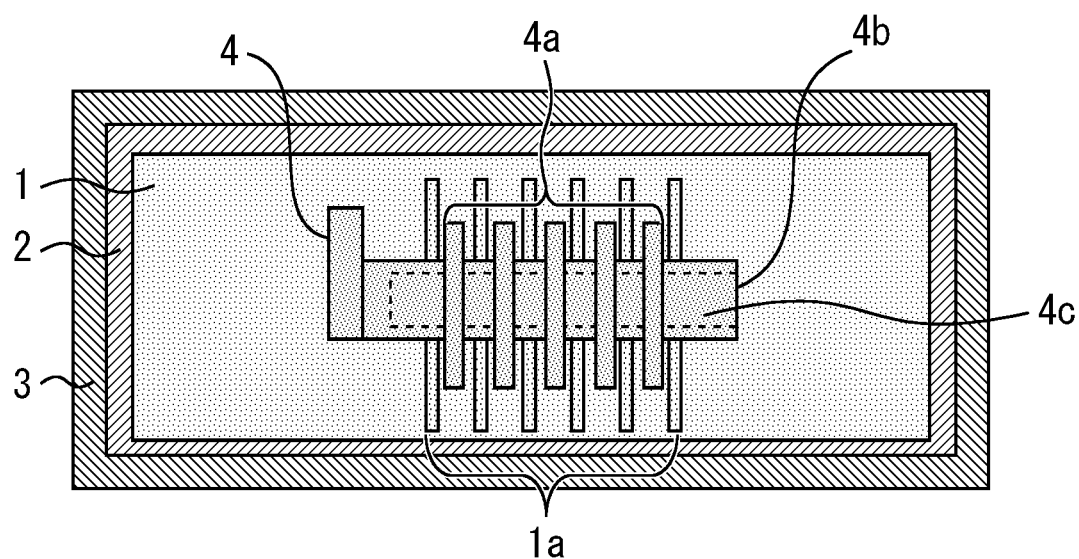
FIG. 2 is a plan view illustrating the pre-welding state of the weld structure according to the first embodiment of the present disclosure.

FIG. 2 is a plan view illustrating the pre-welding state of the weld structure according to the first embodiment of the present disclosure. The tip of the terminal electrode 4 has a pleated circuit pattern 4a and contacts the wiring pattern 1a such that the raised portions of the pleats mesh with the raised portions of the wiring pattern 1a. The tip of the terminal electrode 4 also has a terminal electrode tip aperture 4b and is shaped such that a bag-shaped internal space 4c is formed inward from the aperture. The terminal electrode 4 is formed from Al or Cu, but the circuit pattern 4a does not have to be Al or Cu in a pure state and may also subjected to a nickel (Ni) plating treatment.

Note that although a configuration in which the raised portions of the wiring pattern 1a and the circuit pattern 4a alternately mesh with each other is illustrated herein, any configuration is possible insofar as the terminal electrode 4 is grounded in a freestanding state after welding. For example, a configuration in which the circuit pattern 4a has a spiral raised shape or the like is also possible.

The method of welding the terminal electrode 4 and the insulating substrate 1 according to the first embodiment will be described. First, a jig is used to securely align the circuit pattern 4a and the wiring pattern 1a in a meshing position. Next, compressed air is injected into the internal space 4c from the terminal electrode tip aperture 4b. The pressure of the compressed air is regulated via a pressure regulator to be from 0.6 MPa to 0.8 MPa, for example.

The internal space 4c, lacking an exhaust port, swells when filled with the compressed air. As the internal space 4c swells, the tip of the terminal electrode 4 undergoes plastic deformation, thereby inducing a change in the pitch between the raised and lowered shapes of the pleats in the circuit pattern 4a. As a result, the clearance with respect to the wiring pattern 1a is filled up, causing the terminal electrode 4 to be grounded in a freestanding state.

Figure 3:
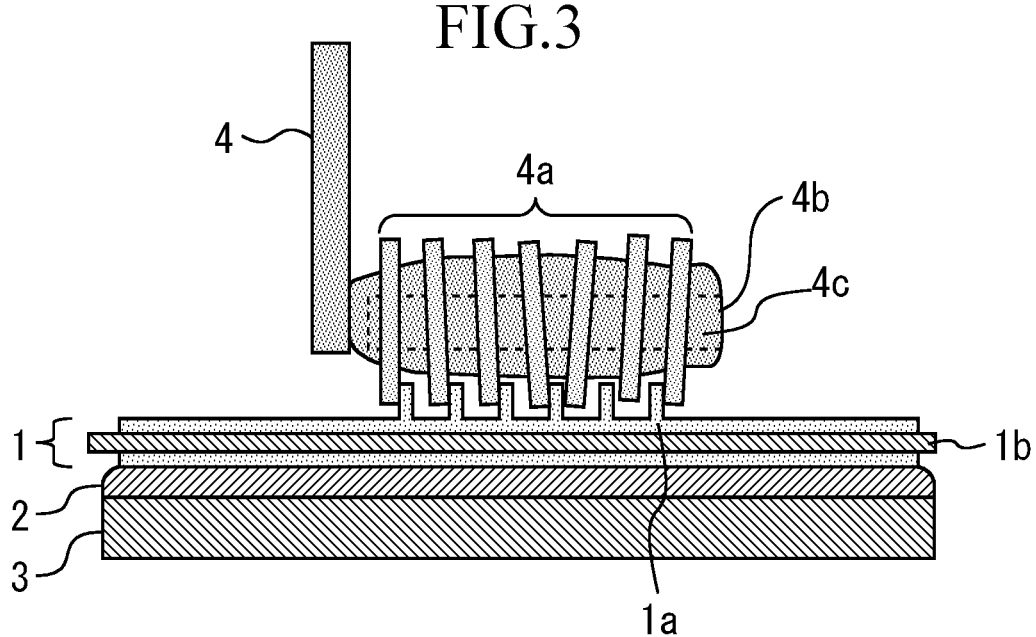
FIG. 3 is a cross section illustrating the post-welding state of the weld structure according to the first embodiment of the present disclosure.
Figure 4:
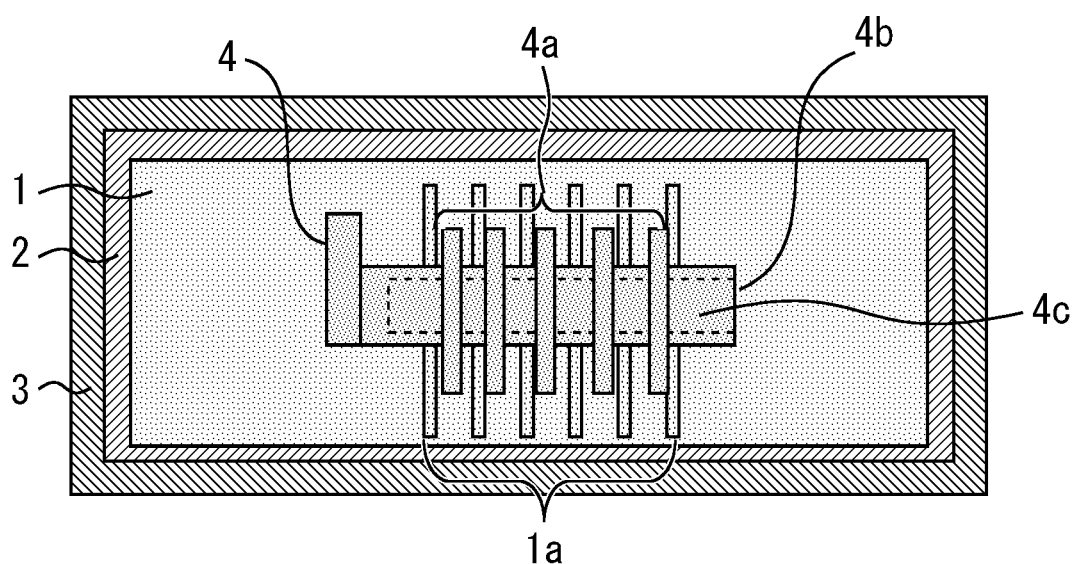
FIG. 4 is a plan view illustrating the post-welding state of the weld structure according to the first embodiment of the present disclosure.

FIG. 3 is a cross section illustrating the post-welding state of the weld structure according to the first embodiment of the present disclosure. Also, FIG. 4 is a plan view illustrating the post-welding state of the weld structure according to the first embodiment of the present disclosure. As described above, in the first embodiment, compressed air is injected from the terminal electrode tip aperture 4b to cause the tip of the terminal electrode 4 to swell. As a result, the clearance between the circuit pattern 4a and the wiring pattern 1a is filled up as in FIG. 3, which causes the terminal electrode 4 to be grounded in a freestanding state.

Second Embodiment

In a second embodiment, the configuration of the weld structure is similar to the first embodiment, but the second embodiment differs in that pure water is injected from the terminal electrode tip aperture 4b.

The method of welding the terminal electrode 4 and the insulating substrate 1 according to the second embodiment will be described. First, a jig is used to securely align the circuit pattern 4a and the wiring pattern 1a in a meshing position. Next, industrial pure water is injected into the internal space 4c from the terminal electrode tip aperture 4b. The pressure of the industrial pure water is regulated via a pressure regulator to be from 0.6 MPa to 0.8 MPa, for example.

The internal space 4c, lacking an exhaust port, swells when filled with the industrial pure water. As the internal space 4c swells, the tip of the terminal electrode 4 undergoes plastic deformation, thereby inducing a change in the pitch between the raised and lowered shapes of the pleats in the circuit pattern 4a. As a result, the clearance with respect to the wiring pattern 1a is filled up, causing the terminal electrode 4 to be grounded in a freestanding state.

Third Embodiment

Figure 5:
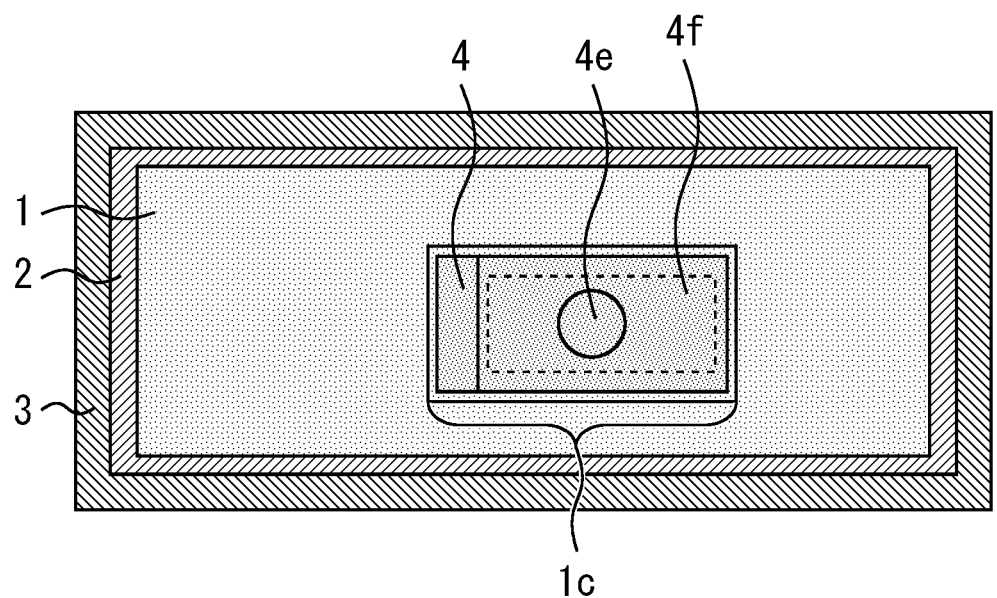
FIG. 5 is a plan view illustrating the pre-welding state of the weld structure according to a third embodiment of the present disclosure.

FIG. 5 is a plan view illustrating the pre-welding state of the weld structure according to a third embodiment of the present disclosure. In the third embodiment, the shape pertaining to the mating of the terminal electrode 4 and the insulating substrate 1 is different from other embodiments.

The weld structure according to the third embodiment comprises a wiring pattern 1c having a recessed shape in the surface layer of the insulating substrate 1. The weld structure according to the third embodiment also comprises a terminal electrode 4. The terminal electrode 4 has a terminal electrode tip 4d that meshes with the inner sides of the wiring pattern 1c. The terminal electrode 4 also has a terminal electrode tip aperture 4e and is shaped such that a bag-shaped internal space 4f is formed inward from the aperture.

The method of welding the terminal electrode 4 and the insulating substrate 1 according to the third embodiment will be described. First, a jig is used to securely align the terminal electrode tip 4d and the wiring pattern 1c in a meshing position. Next, compressed air is injected into the internal space 4f from the terminal electrode tip aperture 4e. The pressure of the compressed air is regulated via a pressure regulator to be from 0.6 MPa to 0.8 MPa, for example.

The internal space 4f, lacking an exhaust port, swells when filled with the compressed air. As the internal space 4f swells, the terminal electrode tip 4d undergoes plastic deformation, thereby filling up the clearance with respect to the wiring pattern 1c. As a result, the terminal electrode 4 is grounded in a freestanding state.

Figure 6:
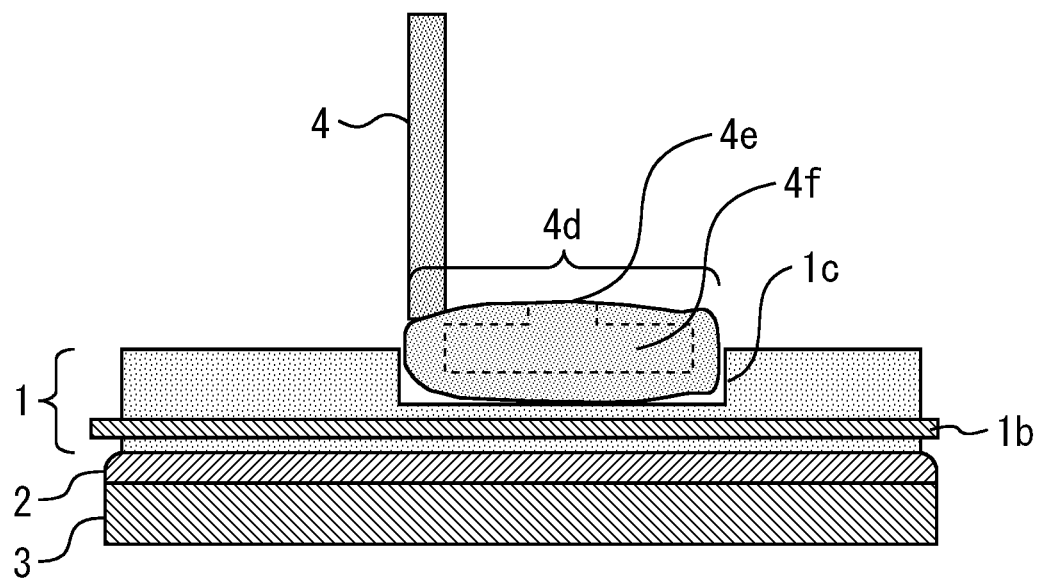
FIG. 6 is a cross section illustrating the post-welding state of the weld structure according to the third embodiment of the present disclosure.

FIG. 6 is a cross section illustrating the post-welding state of the weld structure according to the third embodiment of the present disclosure. As described above, in the third embodiment, compressed air is injected from the terminal electrode tip aperture 4e to cause the terminal electrode tip 4d to swell. As a result, the clearance between the terminal electrode tip 4d and the wiring pattern 1c is filled up as in FIG. 6, which causes the terminal electrode 4 to be grounded in a freestanding state.

Obviously many modifications and variations of the present disclosure are possible in the light of the above teachings. It is therefore to be understood that within the scope of the appended claims the invention may be practiced otherwise than as specifically described.

The entire disclosure of a Japanese Patent Application No. 2022-61965, filed on Apr. 1, 2022 including specification, claims, drawings and summary, on which the Convention priority of the present application is based, are incorporated herein by reference in its entirety.

The invention claimed is:

1. A semiconductor device comprising:
   an insulating substrate having a wiring pattern in a surface layer thereof; and
   a terminal electrode having a bag-shaped internal space with a terminal electrode tip aperture, wherein
   the terminal electrode is grounded in a freestanding state by mating with the wiring pattern.

2. The semiconductor device according to claim 1, wherein
   the wiring pattern has a raised shape,
   the terminal electrode includes a circuit pattern having a pleated shape, and
   the circuit pattern is grounded in a freestanding state by mating with the wiring pattern.

3. The semiconductor device according to claim 1, wherein
   the wiring pattern has a recessed shape, and
   the terminal electrode is grounded in a freestanding state by mating with the wiring pattern.

* * * * *